(12) United States Patent
Ghanayem et al.

(10) Patent No.: US 6,271,129 B1
(45) Date of Patent: Aug. 7, 2001

(54) METHOD FOR FORMING A GAP FILLING REFRACTORY METAL LAYER HAVING REDUCED STRESS

(75) Inventors: Steve Ghanayem, Sunnyvale; Maitreyee Mahajani, San Jose, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 08/984,438

(22) Filed: Dec. 3, 1997

(51) Int. Cl.⁷ .................................................. H01L 21/44
(52) U.S. Cl. .................. 438/675; 427/97; 427/99; 427/124; 427/126; 438/654; 438/655; 438/656; 438/657; 438/672; 438/680; 438/685
(58) Field of Search ........................ 438/644, 654, 438/655, 656, 657, 675, 672, 680, 685; 427/97, 99, 124, 126

(56) References Cited

U.S. PATENT DOCUMENTS

| | | | |
|---|---|---|---|
| 4,751,101 | 6/1988 | Joshi | 427/39 |
| 4,985,371 | 1/1991 | Rana et al. | 437/189 |
| 5,272,112 | 12/1993 | Schmitz et al. | 437/192 |
| 5,369,300 | 11/1994 | Heideman et al. | 257/651 |
| 5,391,394 | 2/1995 | Hansen | 427/124 |
| 5,407,698 | 4/1995 | Emesh | 427/99 |
| 5,643,632 | 7/1997 | Lo | 427/250 |

FOREIGN PATENT DOCUMENTS

| | | |
|---|---|---|
| 0437110A2 | 7/1991 | (EP) . |
| 0587401A2 | 3/1994 | (EP) . |
| 02251139 | 10/1990 | (JP) . |
| 03280545 | 12/1991 | (JP) . |
| 10-032248 | 2/1998 | (JP) . |

Primary Examiner—David Nelms
Assistant Examiner—Reneé R. Berry
(74) Attorney, Agent, or Firm—Townsend and Townsend and Crew LLP (57) ABSTRACT

A method for forming a refractory metal layer that features two-stage nucleation prior to bulk deposition of the same. The method includes placing a substrate in a deposition zone, flowing, into the deposition zone during a first deposition stage, a silicon source, such as a silane gas, and a tungsten source, such as tungsten-hexafluoride gas, so as to obtain a predetermined ratio of the two gases therein. During a second deposition stage, subsequent to the first deposition stage, the ratio of the two gases is varied. Specifically, in the first deposition stage there is a greater quantity of silane gas than tungsten-hexafluoride gas. In the second deposition stage there may be a greater quantity of tungsten-hexafluoride than silane.

34 Claims, 6 Drawing Sheets

METHOD FOR FORMING A GAP FILLING REFRACTORY METAL LAYER HAVING REDUCED STRESS

BACKGROUND OF THE INVENTION

The present invention relates to the fabrication of integrated circuits. More particularly, the invention provides a technique, including a method and apparatus, for forming improved refractory metal layers having reduced stress while providing good gap filling properties.

Deposition of refractory metals, such as tungsten, over a semiconductor substrate is a common step in the formation of some integrated circuit (IC) structures. For example, tungsten is commonly used to provide electrical contact to portions of a semiconductor substrate. These electrical contacts are usually provided through openings in an insulation layer, such as a silicon dioxide layer, formed over the substrate. One method used to form such contacts includes the chemical vapor deposition (CVD) of tungsten to fill the opening after an initial layer of titanium nitride has been deposited in the opening. As another example, tungsten is sometimes used to form metal lines over a semiconductor substrate.

One CVD technique that has been employed to deposit tungsten films in the semiconductor industry uses tungsten hexafluoride ($WF_6$) and a hydrogen reducing agent, e.g., $H_2$, as precursor gases. This technique includes two main steps: nucleation and bulk deposition. The nucleation step grows a thin layer of tungsten which acts as a growth site for subsequent film. In addition to $WF_6$ and $H_2$, the process gas used in the nucleation step of this technique includes silane ($SiH_4$), and may also include nitrogen ($N_2$) and argon. A bulk deposition step then is used to form the tungsten film. The bulk deposition gas is a mixture containing $WF_6$, $H_2$, $N_2$, and Ar.

Advances in integrated circuit technology have lead to a scaling down of device dimensions and an increase in chip size and complexity. This has necessitated improved methods for low temperature deposition of refractory metals, particularly tungsten, to enhance the gap filling properties and reduce the stress of the same. For purposes of this application, low temperature deposition is defined as a deposition process that occurs at temperatures no greater than 400° C. Traditionally, the gap filling property and the stress are two characteristics of refractory metal layers that have been in conflict. For example, using prior low temperature deposition techniques, refractory metal layers having stress less than $1.5 \times 10^{10}$ dynes/cm$^2$ have been formed; however, the gap filling properties of these layers have been limited to less than 70%. Alternatively, refractory metal layers having gap filling properties greater than 90% have been formed using the aforementioned prior art deposition techniques. These layers, however, typically exhibit stress much greater than $1.5 \times 10^{10}$ dynes/cm$^2$.

What is needed, therefore, is a low temperature deposition process that enables rapid formation of refractory metal layers having reduced stress and superior gap filling properties.

SUMMARY OF THE INVENTION

The present invention provides a method for forming refractory metal layers having reduced stress while maintaining good gap-filling properties. The method does so by including a two-stage nucleation step prior to bulk deposition of a refractory metal.

The method of the present invention includes placing a substrate in a deposition zone, flowing into the deposition zone during a first deposition stage, a silicon source, such as a silane gas, and a tungsten source, such as a tungsten-hexafluoride gas, so as to obtain a predetermined ratio of the two gases therein to commence nucleation of the substrate surface. During a second deposition stage, subsequent to the first deposition stage, the nucleation process is continued with the ratio of the two gases being varied. During the first deposition stage there is a greater quantity of silane gas than tungsten-hexafluoride gas. During the second deposition stage there is a greater quantity of tungsten-hexafluoride gas than silane gas. Also, an additional source of inert gas, such as, argon and/or an additional reducing agent, such as $H_2$, may be introduced to stabilize the gas flow during the first and second deposition stages.

In an exemplary embodiment of the method in accordance with the present invention, a substrate having an anisotropic surface is placed in a deposition zone of a substrate processing chamber. The silane and tungsten-hexafluoride gases are flowed into the deposition zone at approximately 25–35 sccm and 2–7 sccm, respectively. In this fashion, the flow ratio, in the deposition zone, of silane gas to tungsten-hexafluoride gas is greater than 4.0:1.0. During the second deposition stage, the aforementioned ratio is varied so that the ratio of silane gas to tungsten-hexafluoride gas is less than 0.5:1.0, with the flow rates being 12–17 sccm and 25–35 sccm, respectively. Subsequent to the second deposition stage, a bulk deposition stage occurs to form a metal tungsten layer on the substrate. During the bulk deposition stage, a process gas is introduced into the deposition zone which typically includes argon, nitrogen, tungsten-hexafluoride gas and a reduction agent, such as hydrogen gas. Thereafter, the deposition zone is maintained at process conditions suitable for depositing a tungsten layer on the substrate.

These and other embodiments of the present invention, as well as its advantages and features are described in more detail in conjunction with the text below and attached figures.

DETAILED DESCRIPTION OF THE PREFERRED EMBODIMENTS

I. Introduction

The present invention allows for deposition of refractory metal layers having reduced stress and superior gap filling properties. Layers deposited by this method can achieve greater than 90% gap fill for topography having an aspect ratio in the range of 1:1 to 5:1 while providing a tungsten layer having a tensile stress reduced between $2 \times 10^9$ dynes/cm$^2$ and $4 \times 10^9$ dynes/cm$^2$.

II. Exemplary CVD Reactor Chamber

Figure 1A:
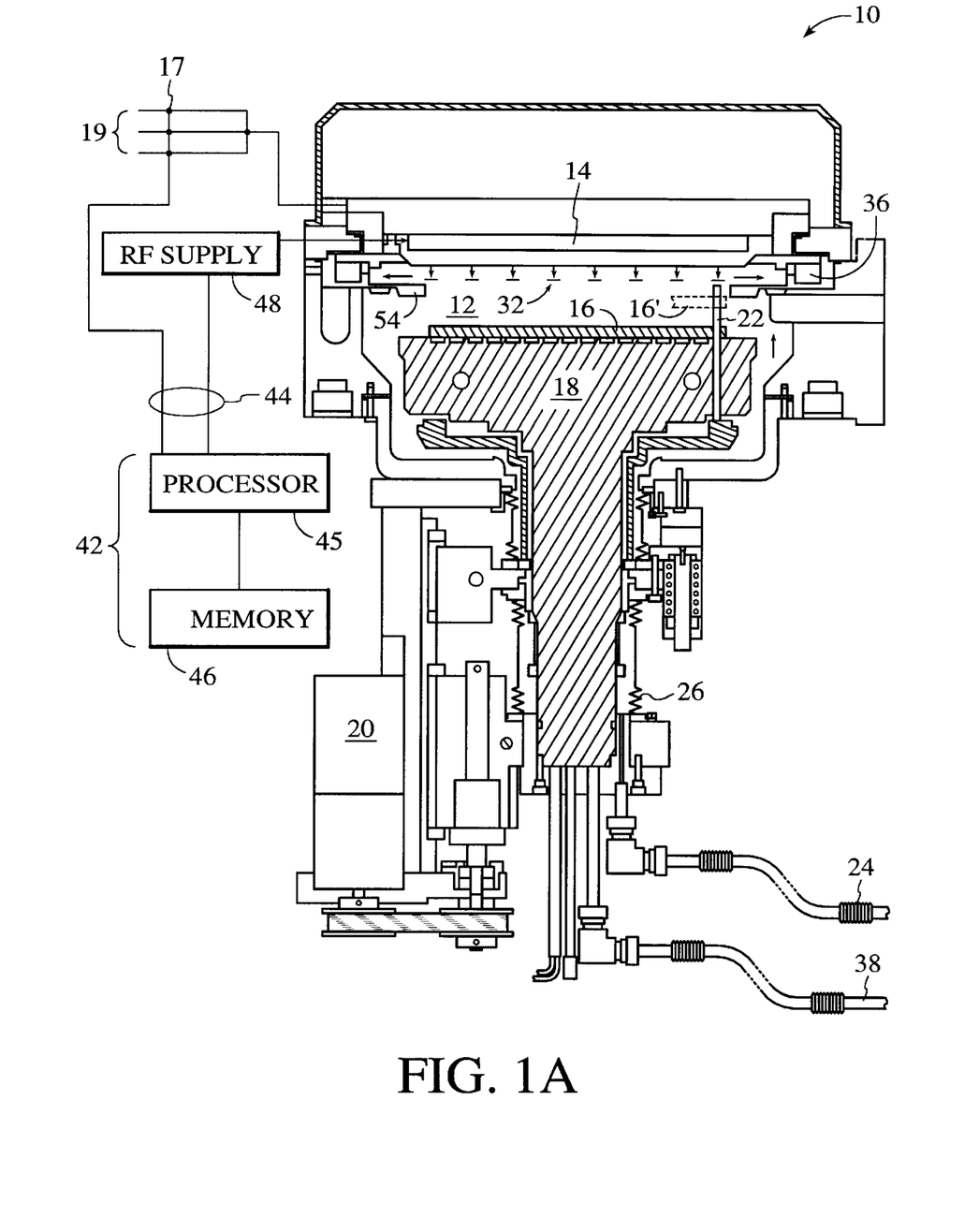
FIG. 1A is a vertical, cross-sectional view of one embodiment of a simplified chemical vapor deposition apparatus according to the present invention.
Figure 1B:
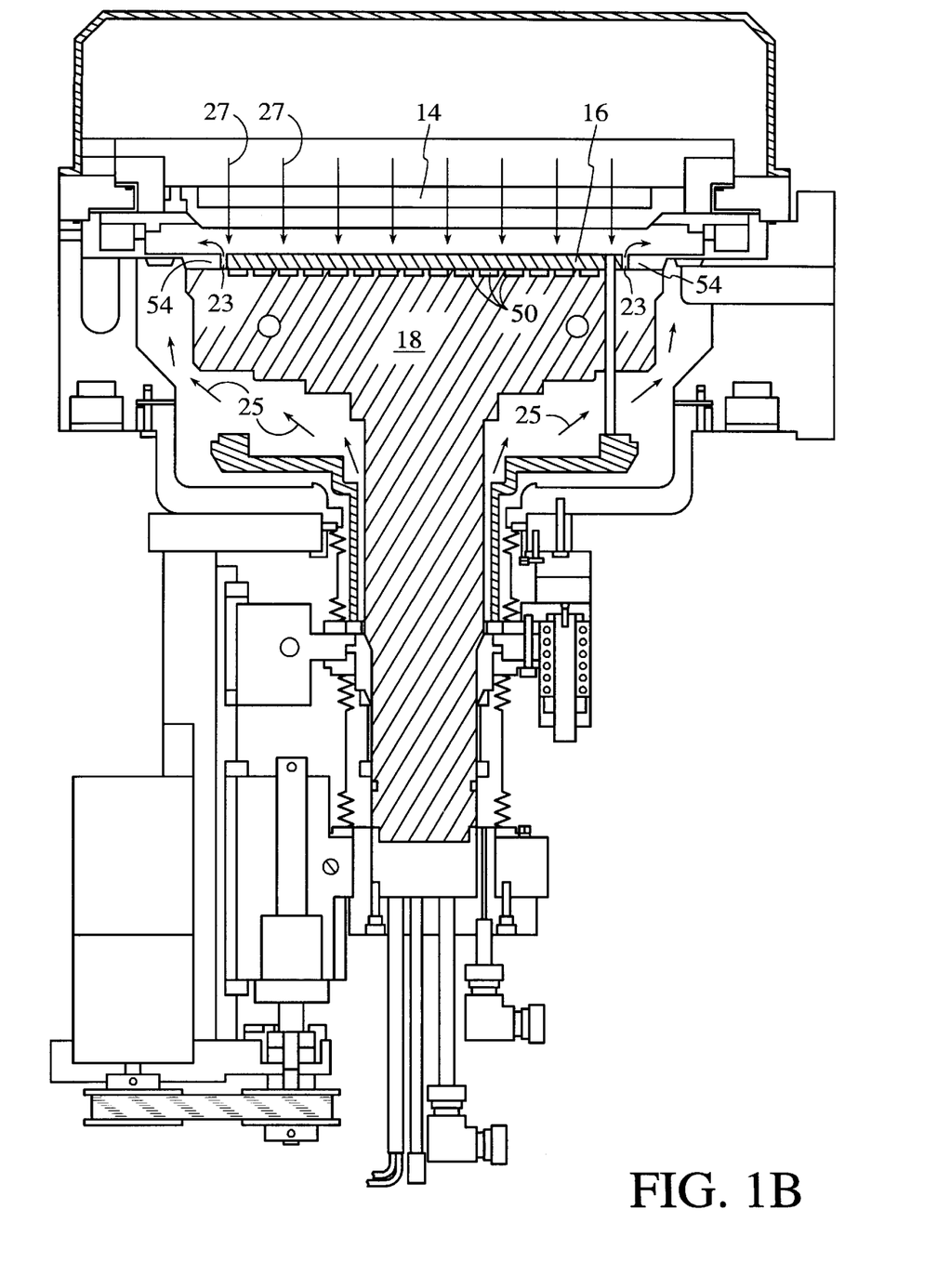
FIG. 1B is a vertical, cross-sectional view of one embodiment of a resistively heated susceptor used in the chamber of FIG. 1 to secure a substrate being processed in chamber.

FIGS. 1A and 1B illustrate one embodiment of a parallel plate, cold-wall chemical vapor deposition system 10 having a vacuum chamber 12 in which the refractory metal layer according to the present invention can be deposited. CVD system 10 contains a gas distribution manifold 14 for dispersing deposition gases to a wafer 16 that rests on a resistively-heated susceptor 18.

Processing chamber 12 may be part of a vacuum processing system having multiple processing chambers connected to a central transfer chamber and serviced by a robot. Substrate 16 is brought into chamber 12 by a robot blade through a slit valve in a sidewall of the chamber (not shown). Susceptor 18 is moveable vertically by means of a motor 20. Substrate 16 is brought into the chamber when susceptor 18 is in a first position with the substrate located opposite to the slit valve shown as 16'. At position 16', substrate 16 is supported initially by a set of pins 22 that pass through, and are coupled to, susceptor 18. Pins 22 are driven by a single motor assembly. As the susceptor 18 is brought to a processing position 32 opposite gas distribution manifold 14, as shown by the dotted line, pins 22 sink into susceptor 18 and substrate 16 is deposited onto the susceptor. Once positioned on susceptor 18, substrate 16 is affixed to the susceptor by a vacuum clamping system, shown more clearly in FIG. 1B as grooves 50.

Referring to both FIGS. 1A and 1B, upon moving upward toward processing position 32, the substrate 16 contacts purge guide 54, which centers the substrate 16 on the susceptor 18. Edge purge gases 23 are flowed through purge guides 54 across the edge of substrate 16 to prevent deposition gases from contacting the edge and backside of the substrate. Purge gases 25 are also flowed around heater/susceptor 18 to minimize deposition on and around the heater/susceptor. These purge gases 25 are supplied from a purge line and are also employed to protect stainless steel bellows 26 from damage by corrosive gases introduced into the chamber during processing.

Deposition and carrier gases are supplied to a deposition zone of the chamber through gas lines 19 to manifold 14 in response to the control of valves 17. During processing, gas supplied to manifold 14 is distributed uniformly across the surface of the substrate as shown by arrows 27. Spent processing gases and by-product gases are exhausted from the chamber by means of exhaust system 36. The rate at which gases are released through exhaust system 36 into an exhaust line is controlled by a throttle valve (not shown). During deposition, a second purge gas through gas channels in the susceptor (not shown) and feed line 38 feeds purge gas against the edge of wafer 16 as previously described. An RF power supply 48 can be coupled to manifold 14 to provide for plasma-enhanced CVD (PECVD) cleaning of the chamber.

The throttle valve (not shown), gas supply valves 17, motor 20, resistive heater coupled to susceptor 18, RF power supply 48 and other aspects of CVD system 10 are controlled by a system controller 42 over control lines 44 (only some of which are shown). The system controller 42 includes a processor 45 that operates under the control of a computer program stored in a computer-readable medium such as a memory 46. The computer program establishes the temperature, chamber pressure, timing, mixture of gases, RF power levels, susceptor position, and other parameters of a particular process. The computer program can be written in any conventional computer readable programming code, for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Windows™ library routines. To execute the linked, compiled object code the system user invokes the object code, causing the computer system to load the code in memory. The processor 45 then reads and executes the code to perform the tasks identified in the program.

The memory 46, employed to store the computer program, may include a floppy disk drive, tape drive or other storage media. Typically, the system controller 42 components consist of a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

Figure 1C:
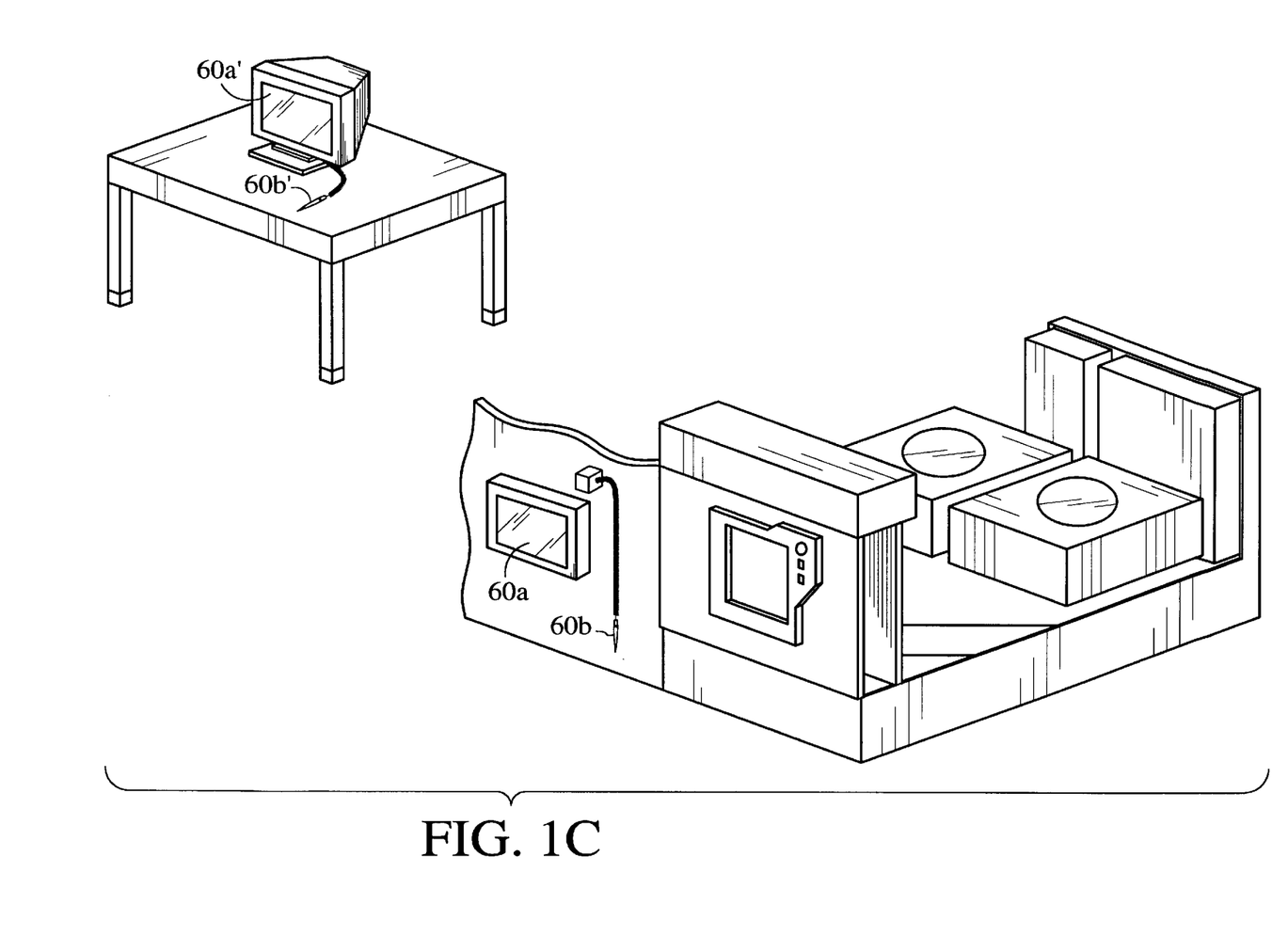
FIG. 1C is a simplified diagram of system monitor and CVD system 100 in a multi-chamber system, which may include one or more chambers.

Referring to FIGS. 1A and 1C, the interface between a user and the system controller 42 is via a CRT monitor 60a and light pen 60b. In the preferred embodiment, two monitors 60a are used, one mounted in the clean room wall for the operators and the other behind the wall for the service technicians. The monitors 60a simultaneously display the same information, but only one light pen 60b is enabled. A light sensor in the tip of light pen 60b detects light emitted by CRT display. To select a particular screen or function, the operator touches a designated area of the display screen and pushes the button on the pen 60b. The touched area changes its highlighted color, or a new menu or screen is displayed, confirming communication between the light pen and the display screen. Other devices, such as a keyboard, mouse, or other pointing or communication device, may be used instead of or in addition to light pen 60b to allow the user to communicate with controller 42.

Figure 1D:
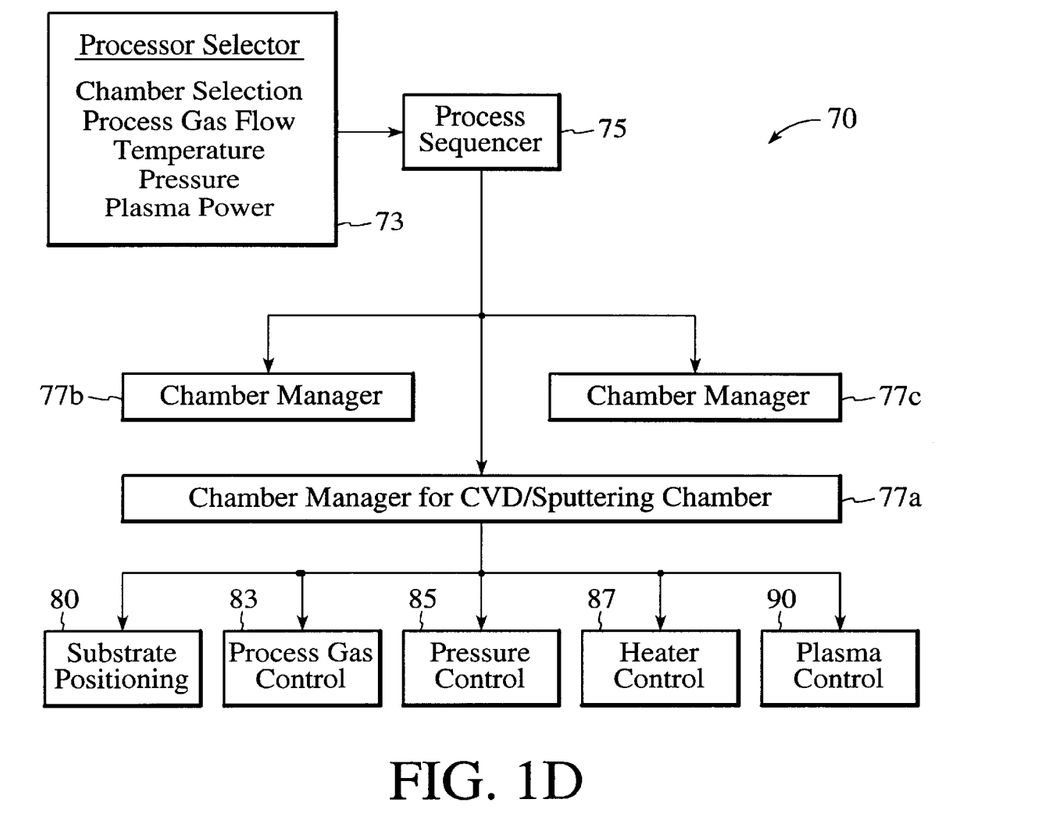
FIG. 1D shows an illustrative block diagram of the hierarchical control structure of the system control software, computer program 170, according to a specific embodiment.

Referring to FIGS. 1C and 1D, using the light pen interface, a user enters a process set number and process chamber number into a process selector subroutine 73 at computer program 70 in response to menus or screens displayed on the CRT monitor. The process sets are predetermined sets of process parameters necessary to carry out specified processes, and are identified by predefined set numbers. The process selector subroutine 73 identifies (i) the desired process chamber and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and are entered utilizing the light pen/CRT monitor interface. The signals for monitoring the process are provided by the analog and digital input boards of the system controller, and the signals for controlling the process are output on the analog and digital output boards of CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably, the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the process sequencer subroutine 75 takes into consideration the present condition of the process chamber being used in comparison with the desired process conditions for a selected process, or the "age" of each particular user entered request, or any other relevant factor a system programmer desires to include for determining scheduling priorities.

Referring to both FIGS. 1A and 1D, once the sequencer subroutine 75 determines which process chamber and process set combination is going to be executed next, the process sequencer subroutine 75 initiates execution of the process set by passing the particular process set parameters to a chamber manager subroutine 77a–c, which controls multiple processing tasks in the process chamber 12 according to the process set determined by the process sequencer subroutine 75. For example, the chamber manager subroutine 77a comprises program code for controlling sputtering and CVD process operations in the process chamber 12. The chamber manager subroutine 77 also controls execution of various chamber component subroutines that control operation of the chamber components necessary to carry out the selected process set.

Examples of chamber component subroutines are substrate positioning subroutine 80, process gas control subroutine 83, pressure control subroutine 85, heater control subroutine 87 and plasma control subroutine 90, in some embodiments. A person having ordinary skill in the art will readily recognize that other chamber control subroutines can be included depending on what processes are to be performed in the process chamber 12. In operation, the chamber manager subroutine 77a selectively schedules or calls the process component subroutines in accordance with the particular process set being executed. The chamber manager subroutine 77a schedules the process component subroutines much like the sequencer subroutine 75 schedules which process chamber 12 and process set are to be executed next. Typically, the chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 1A and 1D. The substrate positioning subroutine 80 comprises program code for controlling chamber components that are used to load the substrate 16 onto susceptor 18 and, optionally, to lift the substrate to a desired height in the chamber 12 to control the spacing between the substrate and the gas distribution manifold 14. When a substrate is loaded into the process chamber 12, the susceptor 18 is lowered to receive the substrate, and thereafter, the susceptor 18 is raised to the desired height in the chamber, to maintain the substrate at a first distance or spacing from the gas distribution manifold during the CVD process. In operation, the substrate positioning subroutine 80 controls movement of the susceptor 18 in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates and for activating the safety shut-off valves when an unsafe condition is detected.

In some processes, an inert gas such as helium or argon is flowed into the chamber 12 to stabilize the pressure in the chamber before reactive process gases are introduced. For these processes, the process gas control subroutine 83 is programmed to include steps for flowing the inert gas into the chamber 12 for an amount of time necessary to stabilize the pressure in the chamber, and then the steps described above would be carried out.

The pressure control subroutine 85 comprises program code for controlling the pressure in the chamber 12 by regulating the size of the opening of the throttle valve in the exhaust system of the chamber. The size of the opening of the throttle valve is set to control the chamber pressure to the desired level in relation to the total process gas flow, size of the process chamber, and pumping setpoint pressure for the exhaust system. When the pressure control subroutine 85 is invoked, the desired, or target, pressure level is received as a parameter from the chamber manager subroutine 77a. The pressure control subroutine 85 operates to measure the pressure in the chamber 12 by reading one or more conventional pressure manometers connected to the chamber, to compare the measured value(s) to the target pressure, to obtain PID (proportional, integral, and differential) values from a stored pressure table corresponding to the target pressure, and to adjust the throttle valve according to the PID values obtained from the pressure table. Alternatively, the pressure control subroutine 85 can be written to open or close the throttle valve to a particular opening size to regulate the chamber 12 to the desired pressure.

The heater control subroutine 87 comprises program code for controlling the current to a heating unit that is used to heat the substrate 20. The heater control subroutine 87 is also invoked by the chamber manager subroutine 77a and receives a target, or set-point, temperature parameter. The heater control subroutine 87 determines the temperature by measuring voltage output of a thermocouple located in susceptor 18, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. When an embedded loop is used to heat the susceptor 18, the heater control subroutine 87 gradually controls a ramp up/down of current applied to the loop. Additionally, a built-in fail-safe mode can be included to detect process safety compliance, and can shut down operation of the heating unit if the process chamber 12 is not properly set up.

In some embodiments, the chamber 12 is outfitted with an RF power supply 48 that is used for chamber cleaning or other operations. When a chamber cleaning plasma process is employed, plasma control subroutine 90 comprises program code for setting the frequency RF power levels applied to the process electrodes in the chamber 12. Similar to the previously described chamber component subroutines, the plasma control subroutine 90 is invoked by the chamber manager subroutine 77a.

The above CVD system description is mainly for illustrative purposes and should not be considered as limiting the scope of the present invention. Variations of the above described system, such as variations of platen or susceptor design, heater design, location of RF power connections and others are possible. The method for depositing a tungsten layer according to the present invention is not limited to any specific processing apparatus.

III. Depositing Tungsten Layers

Figure 2:
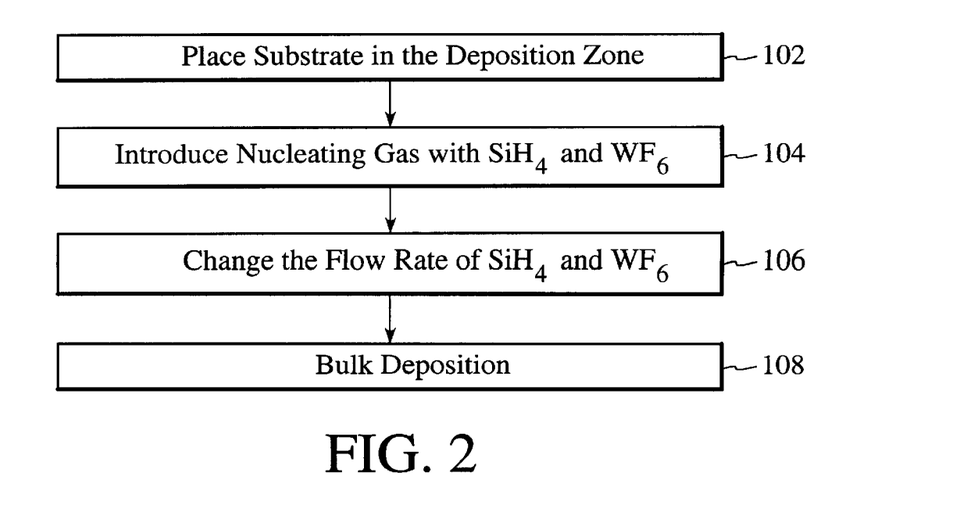
FIG. 2 is a flowchart illustrating the steps of a preferred embodiment of the present invention.

The method of the present invention may be employed to deposit improved tungsten layers in a substrate processing chamber, such as the exemplary CVD chamber described above with reference to FIGS. 1A–1D. FIG. 2 illustrates a preferred process of the invention that is used for nucleating a surface of a substrate onto which a refractory metal is to be deposited. The process described is with respect to use of a refractory metal layer to form a contact that is deposited atop of a diffusion barrier layer such as TiN. However, this description is for exemplary purposes, because the process may be employed to reduce the stress in a refractory metal layer deposited over a semiconductor substrate to form metal interconnect lines. Where applicable, reference numbers in the description below are used to refer to appropriate components of the exemplary chamber 12 of FIGS. 1A–1D. This process is implemented and controlled using a computer program stored in the memory 46 of the CVD system 10.

Figure 3:
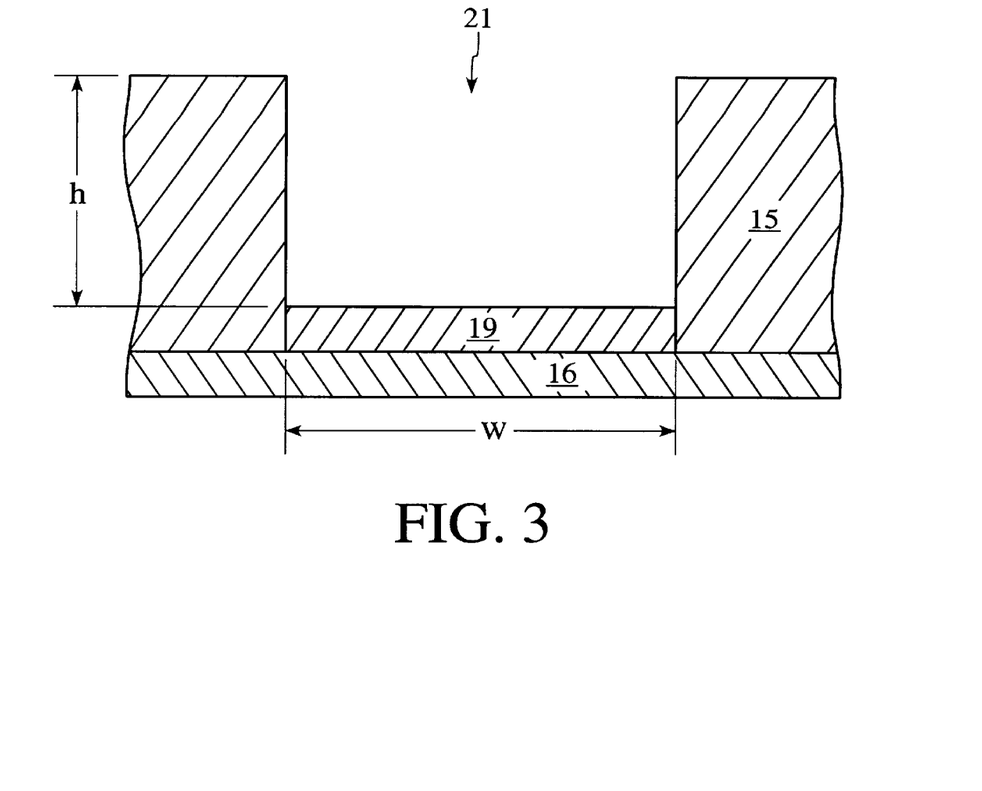
FIG. 3 cross-sectional view of a substrate employed in the present invention.

Referring to FIGS. 1A, 2 and 3, the method includes the step 102 of placing the substrate 16 in the deposition zone, located proximate to the processing position 32. Although the substrate may have virtually any topography, the substrate 16 typically has stepped surfaces, shown more clearly in FIG. 3. To that end, the substrate 16 may have one or more film layers, shown as 15 and 19. The film layer 15 is typically etched to form one or more vias 21, before deposition of a refractory metal layer employing the present invention. After the substrate 16 is placed in the deposition zone, a nucleating gas is introduced, defining a first deposition step 104. The aforementioned nucleating gas consists of a silicon source, such as a silane gas, $SiH_4$, and a refractory metal source. Also included in the nucleating gas are $N_2$, $H_2$ and Ar gases.

In an exemplary embodiment, layer 15 is formed from a dielectric, such as silicon dioxide, and layer 19 is formed from titanium nitride (TiN). Layer 23, therefore, is formed from a refractory metal source, such as tungsten hexafluoride $WF_6$. During the first deposition step 104, it is preferred that the flow ratio of $SiH_4$ to $WF_6$ is established to be greater than 4:1. More preferably the ratio of $SiH_4$ to $WF_6$ is 6:1, with the flow rate being 30 sccm and 5 sccm, respectively. The flow rates for the Ar, $N_2$ and $H_2$ gases are 1000 sccm, 300 sccm and 1000 sccm, respectively. Typically, the pressure of the atmosphere in the chamber 12 is in the range of 1 to 200 torr, with 4.5 to 30 torr being preferred, during the first deposition step, and the temperature may be in the range of 300 to 500° C. For example the chamber pressure and temperature may be established to be 4.5 torr and 350° C. The $SiH_4$ and $WF_6$ gases are introduced into the deposition chamber for a predetermined amount of time which is dependent upon both the temperature and the desired thickness of the resulting layer. For example, at the aforementioned temperature range, a silicon rich layer having a thickness in the range of 50 to 100 angstroms may be formed in three to ten seconds. However, it is preferable that the deposition step 104 have a duration of approximately five seconds.

Subsequent to the first deposition step 104, the flow rates of the $SiH_4$ and $WF_6$ gases are decreased so that the flow ratio of the two gases is less than 1:1, defining a second deposition step 106. More preferably, the flow ratio of the two gases is 1:2, with the flow rates of $SiH_4$ gas and $WF_6$ gas being changed to 15 sccm and 30 sccm, respectively. During the second deposition step 106, the pressure of the atmosphere in the chamber is increased to be within the range of 1 to 200 torr, with 4.5 to 30 torr being the preferred range. Although it is not necessary, in the exemplary embodiment, a constant temperature may be maintained between the first 104 and second 106 deposition steps. The duration of the second deposition step 106 is typically fifteen seconds, resulting in the formation, on the surface of the substrate 16, of a layer having a thickness approximating 500 angstroms and defining a nucleation layer. After the requisite thickness of one nucleation layer is obtained, a bulk deposition step 108 is commenced in which the appropriate metallization layer, in this case tungsten, is formed.

Alternatively, however, the second deposition step 106 may be performed with the chamber pressure being manned at 4.5 torr. In this instance, the preferred ratio the $SiH_4$ gas and $WF_6$ gas is still 1:2, but the flow rates of $SiH_4$ gas and $WF_6$ gas are 10 sccm and 20 sccm, respectively. This results in a longer deposition time, typically thirty seconds.

The bulk deposition step 108 includes introduction, into the deposition zone, of a process gas, for this example, having argon gas, Ar, tungsten-hexafluoride gas, $WF_6$, and a reduction agent, such as hydrogen gas, $H_2$. Both the $N_2$ gas and the $SiH_4$ gas flows are terminated in the bulk deposition step 108, with the flow rate for the Ar gas being between 1000 and 6000 sccm, depending upon the chamber 12 temperature. The flow rate of the $WF_6$ gas is between 60 and 500 sccm, with 95 sccm being preferred. Similar to the first 104 and second 106 deposition steps, the duration of the bulk deposition step 108 may vary, depending upon the chamber 12 temperature and the desired thickness of the refractory metal layer. Table 1 below demonstrates the deposition conditions for a 2500 angstrom thick film layer deposited to fill a via, such as via 21, having an aspect ratio in the range of 1:1 to 5:1, at 400° C. The aspect ratio is defined as the magnitude of the via 21's length, l, to the via 21's width, w.

TABLE 1

| Step | First Deposition | Second Deposition | Bulk Deposition |
|---|---|---|---|
| Time (Sec) | 5 | 15 | 65 |
| Temperature (° C.) | 400 | 400 | 400 |
| Pressure (Torr) | 30 | 30 | 90 |
| Heater Spacing (mils) | 400 | 400 | 400 |
| $WF_6$ (sccm) | 5 | 30 | 95 |
| $H_2$ (sccm) | 1000 | 1000 | 1000–1200 |
| $SiH_4$ (sccm) | 30 | 10 | — |
| Ar (sccm) | 1000 | 1000 | 2800 |
| $N_2$ (sccm) | 300 | 300 | — |

Figure 4:
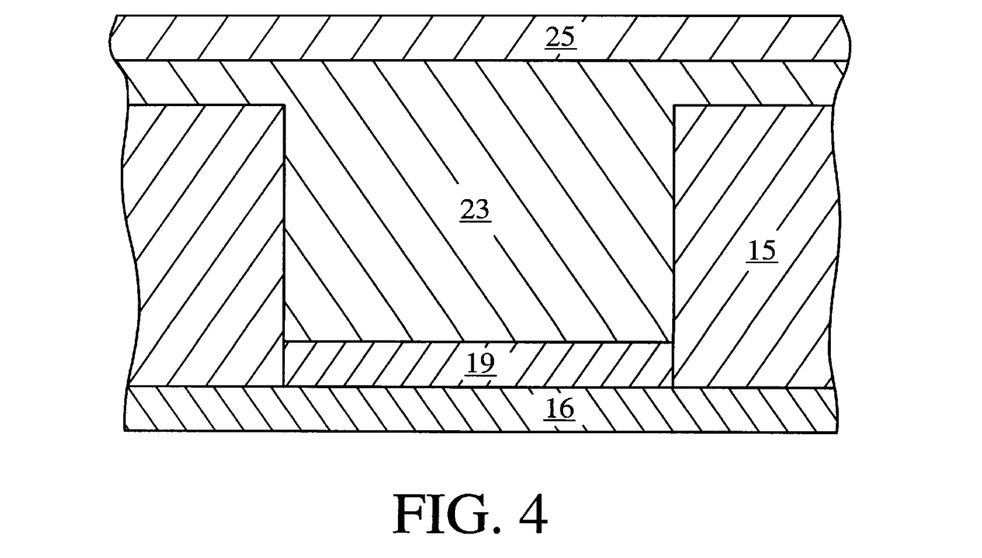
FIG. 4 is a cross-sectional view of the substrate shown in FIG. 3 with a gap-filling refractory metal layer disposed upon the substrate.

The process described in Table 1 results in the reduction of the overall stress, in a gap-filling tungsten layer 23, shown more clearly in FIG. 4, in the range of $2 \times 10^9$ dynes/cm$^2$ to $4 \times 10^9$ dynes/cm$^2$.

In an experiment, various parameters of a tungsten layer deposited employing the two-stage nucleation process, including stress, reflectance and sheet resistance uniformity were measured. The results, as shown in Table 2 are as follows:

TABLE 2

| Film Stack | Temperature ° C. | Film thickness* (Å) | Stress* dynes/cm$^2$ |
|---|---|---|---|
| 3000 Å | 350 | 3157 | $1.52 \times 10^{10}$ |
| 4000 Å | 350 | 4004 | $1.47 \times 10^{10}$ |
| 5000 Å | 350 | 5152 | $1.39 \times 10^{10}$ |
| 3000 Å | 375 | 3157 | $1.47 \times 10^{10}$ |
| 4000 Å | 375 | 4004 | $1.42 \times 10^{10}$ |
| 5000 Å | 375 | 5152 | $1.38 \times 10^{10}$ |
| 3000 Å | 400 | 3309 | $1.47 \times 10^{10}$ |
| 4000 Å | 400 | 4142 | $1.29 \times 10^{10}$ |
| 5000 Å | 400 | 5078 | $1.20 \times 10^{10}$ |

As seen in Table 2, the stress in a tungsten layer deposited in accord with the two-stage nucleation process varies according to layer thickness and operation temperature of the chamber 12. In addition to the reduced stress in a tungsten layer, the two-stage nucleation process provides the tungsten layer with gap filling properties, equivalent to those of a tungsten layer deposited using conventional techniques. Table 3, below, shows a comparison between a tungsten layer deposited onto a substrate employing conventional techniques, i.e., a single nucleation step, with a tungsten layer deposited in accordance with the disclosed invention. The tungsten layer deposited employing a single nucleation step was formed from a process gas being introduced into the chamber 12 at 375° C. The process gas consists of $SiH_4$, $WF_6$, Ar, $N_2$ and $H_2$ gases flowed in at 10 sccm, 20 sccm 1000 sccm, 300 sccm and 1000 sccm, respectively.

As shown in Table 3, the stress of a 4000 angstrom thick refractory metal layer deposited with a single nucleation step was $1.8 \times 10^{10}$ dynes/cm$^2$. The refractory metal layer deposited in accordance with the disclosed invention exhibits $3.8 \times 10^9$ dynes/cm$^2$ less stress than the refractory metal layer deposited employing the single nucleation step.

TABLE 3

| Nucleation Process | Deposition Rate Å/min | Stress Dynes/cm$^2$ | Gapfilling Properties |
|---|---|---|---|
| Single Stage | 1700 | $1.8 \times 10^{10}$ | 100 |
| Two-Stage | 1800 | $1.42 \times 10^{10}$ | 100 |

Figure 5:
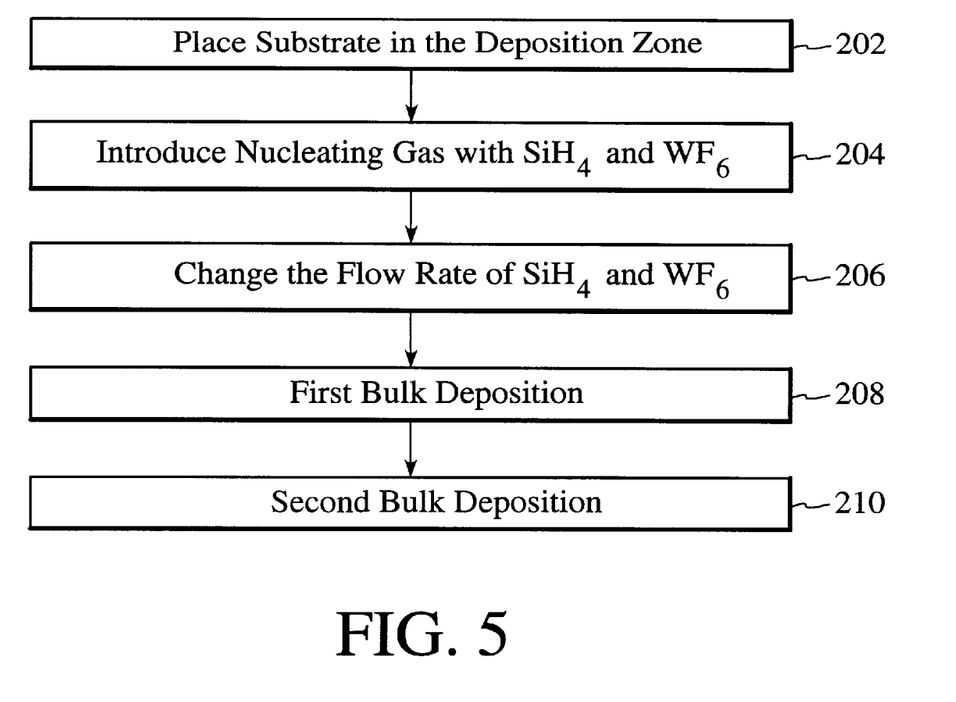
FIG. 5 is a flowchart illustrating the method shown in FIG. 2, including an additional step of bulk deposition to form an interconnect layer on a substrate.

A further reduction in stress of the tungsten layer was demonstrated by forming an interconnect (IC) layer, shown in FIG. 4 as 25, atop of the tungsten layer 23 using the method shown in FIG. 5. The steps 202, 204, 206 and 208 are identical to steps 102, 104, 106 and 108, shown above in FIG. 2. The interconnect layer 25 is formed, by the second bulk deposition step 210, shown in Table 4 as follows:

TABLE 4

| Step | Second Bulk Deposition |
|---|---|
| Time (Sec) | 138 |
| Temperature (° C.) | 400 |
| Pressure (Torr) | 90 |
| Heater Spacing. (mils) | 400 |
| $WF_6$ (sccm) | 5–10 |
| $H_2$ (sccm) | 6000 |
| $SiH_4$ (sccm) | — |
| Ar (sccm) | 2800 |
| $N_2$ (sccm) | — |

Although the layer 25, shown in FIGS. 4, is shown being spaced apart from the layer 15 by a portion of layer 23, typically, layer 25 is disposed atop both layer 15 and layer 23.

Finally, it should be understood, however, that the process shown in FIG. 5 may be employed to reduce the stress in a refractory metal layer deposited over a semiconductor substrate to form metal interconnect lines. To that end, only steps 202, 204, 206 and 210 would be required. For interconnect lines gap fill property may not be so critical, however, the additional stress reduction due to step 204 is desirable for performance enhancement.

What is claimed is:

1. A method for nucleating a substrate, said method comprising:
    placing a substrate in a deposition zone;
    during a first deposition stage flowing, into said deposition zone, a silicon source and a tungsten source so as to obtain a flow ratio of said silicon source to said tungsten source; and
    during a second deposition stage, subsequent to said first deposition stage, decreasing said ratio of said silicon source to said tungsten source.

2. The method as recited in claim 1 wherein said silicon source is flowed into said deposition zone during said first deposition stage at a flow rate greater than a flow rate of said tungsten source and said silicon source is flowed into said deposition zone during said second deposition stage at a flow rate less than a flow rate of said tungsten source.

3. The method as recited in claim 1 wherein said silicon source comprises silane and said tungsten source comprises tungsten-hexafluoride.

4. The method as recited in claim 1 wherein an atmosphere, having a pressure associated therewith, surrounds said deposition zone, and further including increasing, subsequent to said first deposition stage, said pressure.

5. The method as recited in claim 1 wherein both said first and second deposition stages occur at a common temperature.

6. The method as recited in claim 5 wherein said common temperature is between approximately 300 and 500° C.

7. A chemical vapor deposition process for depositing a tungsten layer on a substrate, said method comprising:

placing a substrate in a deposition zone;

during a first deposition stage flowing, into said deposition zone, a tungsten source and a silicon source at a first flow ratio of said silicon source to said tungsten source;

during a second deposition stage, subsequent to said first deposition stage, flowing said tungsten source and silicon source into said deposition zone at a second flow ratio of said silicon source to said tungsten source, wherein said second flow ratio is less than said first flow ratio;

during a third deposition stage, subsequent to said second deposition stage:

(i) flowing, into said deposition zone, a process gas including a tungsten compound and a reduction agent; and (ii) maintaining said deposition zone at process conditions suitable for depositing a tungsten layer on said substrate.

8. The method as recited in claim 7 wherein said ratio is greater than 4:1, during said first deposition stage and said ratio, during said second deposition stage, is less than 1.5:1.

9. The method as recited in claim 7 wherein said silicon source is flowed into said deposition zone during said first deposition stage at a flow rate greater than a flow rate of said tungsten source and said silicon source is flowed into said deposition zone during said second deposition stage at a flow rate less than a flow rate of said tungsten source.

10. The method as recited in claim 7 wherein a refractory film layer is formed on said substrate, at a termination of said first deposition step, having a thickness in the range of 50 to 100 angstroms.

11. The method as recited in claim 10 wherein said thickness of said refractory metal film layer is in the range of 450 to 550 angstroms at a termination of said second deposition stage.

12. The method as recited in claim 11 wherein an atmosphere, having a pressure associated therewith, surrounds said deposition zone, and further including a step of increasing, subsequent to said first deposition stage, said pressure.

13. The method as recited in claim 7 wherein said second deposition stage commences approximately three to ten seconds after said first deposition stage is initiated.

14. The method as recited in claim 11 wherein said tungsten layer has a stress, associated therewith, which is reduced approximately $3.8 \times 10^9$ dynes/cm$^2$.

15. The method as recited in claim 12 wherein said silicon source includes silane and said tungsten source includes tungsten-hexafluoride.

16. The method of claim 7 therein said deposition zone is maintained at substantially the same pressure during said first and second deposition stages and said pressure is increased during said third deposition stage.

17. A chemical vapor deposition process for depositing tungsten over a substrate disposed in a substrate processing chamber, said process comprising:

depositing a first layer of tungsten over said substrate by flowing a first process gas comprising a tungsten source and a silicon source into said chamber, said first process gas having a first flow ratio of said silicon source to said tungsten source during deposition of a first strata of said first layer and having a second flow ratio of said silicon source to said tungsten source during deposition of a second strata of said first layer deposited over said first strata, wherein said second flow ratio is less than said first flow ratio flow ratio; and thereafter, depositing a second layer of tungsten on said first layer by flowing a second process comprising a tungsten source and reducing agent into said chamber.

18. The method as recited in claim 17 wherein said first flow ratio is greater than 4:1.

19. The method as recited in claim 17 wherein said second flow ratio is less than 1.5:1.

20. The method as recited in claim 17 wherein deposition of said second strata of said first layer commences approximately three to ten seconds after deposition of said first layer is initiated.

21. The process of claim 17 wherein said second layer is deposited at a chamber pressure that is higher than a chamber pressure used to deposit said first layer.

22. The processor claim 21 wherein said first process gas further comprises said reducing agent.

23. The process of claims 22 wherein said silicon source is silane, said tungsten source is tungsten hexafluoride and said reducing agent is molecular hydrogen.

24. The process of claim 23 wherein said first process gas further comprises molecular nitrogen and argon and said second process gas further comprises argon.

25. The process of claim 21 wherein said flow of said tungsten source is higher during deposition of said first strata of said first layer than during deposition of said second strata.

26. The process of claim 25 wherein said flow of said silicon source is lower during deposition of said first strata of said first layer than during deposition of said second strata.

27. The process of claim 25 wherein said flow of said tungsten source is increased in said second process gas relative to said first process gas.

28. The process of claim 23 wherein said flow of tungsten hexafluoride is higher during deposition of said first strata of said first layer than during deposition of said second strata.

29. The process of claim 28 wherein said flow of silane is lower during deposition of said first strata of said first layer than during deposition of said second strata.

30. The process of claim 28 wherein said flow of said tungsten hexafluoride is increased in said second process gass relative to said first process gas.

31. The process of claim 17 wherein said first process gas is a nucleation gas and said second process gas is a bulk deposition gas.

32. The process of claim 21 wherein said first and second strata of said first layer are deposited at a substantially equal pressure.

33. The process of claim 21 wherein a flow rate of said silicon source is higher than a flow rate of said tungsten source during deposition of said first strata of said first layer and lower than a flow rate of said tungsten source during deposition of said second strata.

34. The process of claim 21 wherein a flow rate of said silane is higher than a flow rate of said tungsten hexafluoride during deposition of said first strata of said first layer and lower than a flow rate of said tungsten hexafluoride during deposition of said second strata.

* * * * *